(12) United States Patent
Mohai et al.

(10) Patent No.: US 9,406,754 B2
(45) Date of Patent: *Aug. 2, 2016

(54) SMART SEMICONDUCTOR SWITCH

(71) Applicant: Infineon Technologies AG, Neubiberg (DE)

(72) Inventors: Dorin Ioan Mohai, Bucharest (RO); Ilie-Ionut Cristea, Turnu Magurele (RO); Adrian Finney, Villach (AT); Bogdan-Eugen Matei, Braila (RO); Andrei Cobzaru, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 65 days.

This patent is subject to a terminal disclaimer.

(21) Appl. No.: 14/447,174

(22) Filed: Jul. 30, 2014

(65) Prior Publication Data

US 2016/0035834 A1  Feb. 4, 2016

(51) Int. Cl.
| | |
|---|---|
| *H01L 27/146* | (2006.01) |
| *H01L 29/10* | (2006.01) |
| *H01L 29/06* | (2006.01) |
| *H01L 29/739* | (2006.01) |
| *H01L 27/07* | (2006.01) |
| *H03K 17/00* | (2006.01) |

(52) U.S. Cl.
CPC ........ *H01L 29/1095* (2013.01); *H01L 27/0716* (2013.01); *H01L 29/0603* (2013.01); *H01L 29/7395* (2013.01); *H03K 17/00* (2013.01)

(58) Field of Classification Search
CPC .................................................. H01L 29/1095
USPC .......................................... 257/443; 326/101
See application file for complete search history.

(56) References Cited

U.S. PATENT DOCUMENTS 6,800,925 B2    10/2004  Rossmeier et al.
2013/0027114 A1*  1/2013  Petruzzi ............. H03K 17/0822
                                                327/437

OTHER PUBLICATIONS

"CMOS Schmitt Trigger—A Uniquely Versatile Design Component," Fairchild Semiconductor Corporation, Application Note 140, Jun. 1975, 8 pp.
Office Action from U.S. Appl. No. 14/447,246, dated Nov. 19, 2015, 9 pp.
Response to Office Action mailed Nov. 19, 2015, from U.S. Appl. No. 14/447,246, filed Feb. 18, 2016, 8 pp.

* cited by examiner

*Primary Examiner* — Jamie C Niesz
(74) *Attorney, Agent, or Firm* — Shumaker & Sieffert, P.A.

(57) ABSTRACT

A semiconductor device comprises a semiconductor substrate doped with dopants of a first type and a vertical transistor composed of one or more transistor cells. Each transistor cell has a first region formed in the substrate and doped with dopants of a second type, and the first regions form first pn-junctions with the surrounding substrate. At least a first well region is formed in the substrate and doped with dopants of a second type to form a second pn-junction with the substrate. The first well region is electrically connected to the first regions of the vertical transistor via a semiconductor switch. The semiconductor device comprises a detection circuit, which is integrated in the substrate and configured to detect whether the first pn-junctions are reverse biased. The switch is opened when the first pn-junctions are reverse biased and the switch is closed when the first pn-junctions are not reverse biased.

14 Claims, 3 Drawing Sheets

SMART SEMICONDUCTOR SWITCH

TECHNICAL FIELD

The present disclosure relates to the field of integrated electronic circuit devices, particular an integrated electronic circuit device including a MOS transistor and additional circuitry integrated in one semiconductor die.

BACKGROUND

Many power semiconductor switches can be combined with additional low power analog and digital circuitry in one single semiconductor chip. The additional circuitry may additionally include, inter alia, driver circuits for generating driver signals to activate and deactivate the power semiconductor switches, sensor and measurement circuits for processing measured signals such as chip temperature, output current, and circuitry used for communicating with other devices such as microcontrollers or the like. The power semiconductor switches are often implemented as vertical transistors such as vertical MOSFETs or IGBTs. Vertical transistors have the power electrodes (e.g. drain and source electrodes in case of a MOSFET or collector and emitter electrodes in case of an IGBT) on opposing sides (top and bottom) of the semiconductor chip.

In such intelligent semiconductor switches with vertical power transistors, the substrate is usually electrically connected to one load terminal of the power semiconductor switch. If, for example, the power semiconductor switch is a vertical MOS transistor, the drain electrode of the MOS transistor is electrically connected to the semiconductor substrate and thus the drain potential of the transistor also defines the electrical potential of the substrate. The mentioned additional analog and digital circuitry is also integrated in the semiconductor substrate, wherein the circuit components are isolated from the surrounding substrate, for example, by a pn-junction isolation. For example, the substrate may be n-doped and the mentioned additional circuitry may be implemented within a p-doped well (p-well) formed within the n-doped substrate (n-substrate). The resulting pn-junction between the n-substrate and the p-well is reverse biased during the operation of the integrated circuit and thus the pn-junction electrically isolates the circuit components in the p-well from the surrounding n-substrate.

SUMMARY

A semiconductor device is disclosed herein. In accordance with one aspect, the semiconductor device comprises a semiconductor substrate doped with dopants of a first type and a vertical transistor composed of one or more transistor cells. Each transistor cell has a first region formed in the substrate and doped with dopants of a second type, and the first regions form first pn-junctions with the surrounding substrate. At least a first well region is formed in the substrate and doped with dopants of a second type to form a second pn-junction with the substrate. The first well region is electrically connected to the first regions of the vertical transistor via a semiconductor switch. The semiconductor device comprises a detection circuit, which is integrated in the substrate and configured to detect whether the first pn-junctions are reverse biased. The switch is opened when the first pn-junctions are reverse biased and the switch is dosed when the first pn-junctions are not reverse biased.

BRIEF DESCRIPTION OF THE DRAWINGS

The techniques can be better understood with reference to the following drawings and descriptions. The components in the figures are not necessarily to scale; instead emphasis is placed upon illustrating the principles of the techniques. More-over, in the figures, like reference numerals designate corresponding parts. In the drawings.

DETAILED DESCRIPTION

Figure 1:
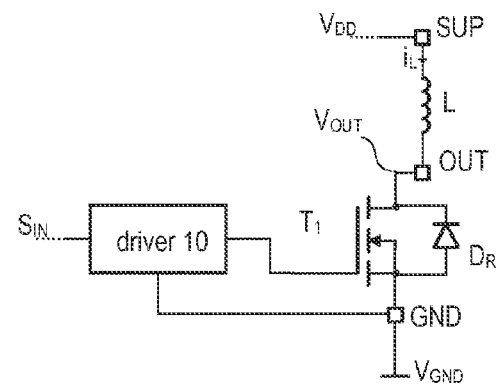
FIG. 1 illustrates the basic configuration of a power MOS transistor as a low-side switch for switching an inductive load.

FIG. 1 illustrates the basic application of a low-side semiconductor switch configured to switch an inductive load L. In the present example, a power MOSFET $T_1$ is used as a semiconductor switch. The MOSFET $T_1$ is integrated in a semiconductor chip together with further analog and digital circuitry such as a gate driver circuit 10. The gate driver circuit 10 receives a logic signal $S_{IN}$ and is configured to generate a corresponding driver signal for switching the semi-conductor switch on and off. In the present example, the driver circuit 10 is connected to the gate of the MOSFET $T_1$ and generates, as driver signal, an appropriate gate voltage or gate current to activate and deactivate the MOS channel of the MOSFET $T_1$. When using low side switches the MOSFET $T_1$ is connected between a first supply node and an output node. The first supply node is usually a ground terminal GND supplied with ground potential $V_{GND}$. The output node is usually connected to a respective external output terminal OUT of the semiconductor chip. The load L is connected between the output terminal OUT and a second supply terminal SUP which is supplied with a supply voltage $V_{DD}$. The supply voltage $V_{DD}$ may also be used to supply the further circuitry integrated in the chip such as the gate driver 10. However, a different voltage supply may be used for this purpose.

When the MOSFET $T_1$ is active the voltage $V_{OUT}$ at the output terminal OUT approximately equals the ground potential $V_{GND}$ and the voltage drop across the load L approximately equals $V_{DD}$. The intrinsic reverse diode $D_R$ of the MOSFET $T_1$ is reverse biased and blocking in normal operation. In some situations, however, the output voltage $V_{OUT}$ may be forced to negative values (with respect to ground potential $V_{GND}$) and thus the reverse diode $D_R$ may become—at least temporarily—forward biased and conductive. Such situations may be, inter alia, disturbances at the supply terminal due to electrostatic discharges (ESD), loss of supply voltage ($V_{DD}$) in combination with an inductive load, etc. While a forward biasing of the reverse diode is not necessarily problematic for the MOSFET $T_1$ itself, it may adversely affect the operation of the further (low power) circuitry integrated in the semiconductor chip. These adverse effects are a result of the specific design of "intelligent power switches" which include vertical power MOSFETs and further (analog and digital) circuitry in one single semi-conductor chip.

Figure 2:
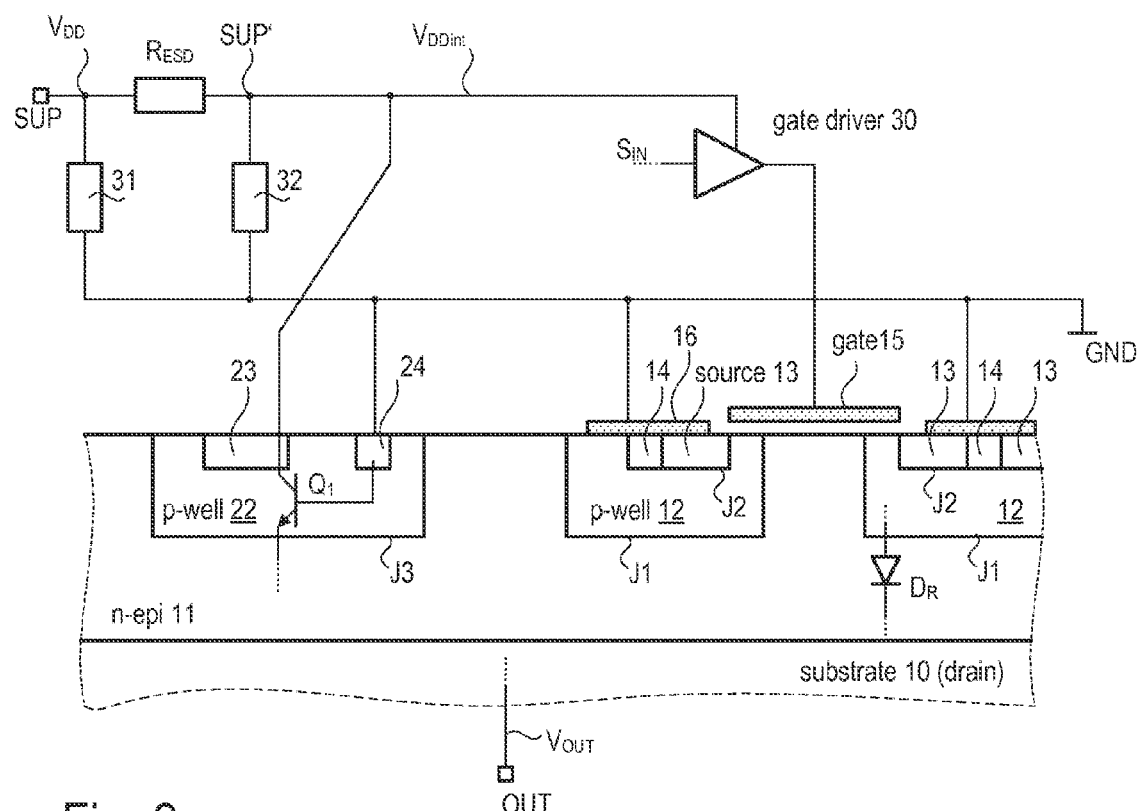
FIG. 2 illustrates one example implementation of the power MOS transistor and additional low power circuitry in one semiconductor chip.

FIG. 2 is a cross sectional view of a semiconductor chip and schematically illustrates one example implementation of an intelligent power switch including a vertical power MOSFET as well as further analog and/or digital circuitry. Such further circuitry may include, inter alia, gate driver circuits for generating gate signals for the MOSFETs, communication circuits for communicating with external controllers, measurement circuits for measuring and processing signals representing physical parameters (e.g. temperature, load current) to be measured, etc. A semiconductor device (e.g. intelligent power switch) includes a semiconductor (silicon) substrate 10 which may have an epitaxial layer 10 of monocrystalline silicon disposed thereon. Substrate 10 and epitaxial layer 11 are doped with dopants of a first type. In the present example, n-type dopants (e.g. phosphor, arsenic, etc) are used. Substrate 10 and epitaxial layer 11 together are referred to as semiconductor body 1 or simply as chip. Several doped well regions 12, 22 are formed in the semiconductor body. The well regions adjoin the top surface of the semiconductor body and extend into the semiconductor body 1 in a vertical direction. The well regions are doped with dopants of a second type. In the present example, p-type dopants (e.g. boron, aluminum, etc.) are used. The p-doped well regions are also referred to as p-wells, which may be formed, for example, by way of diffusion or ion implantation.

A plurality of p-wells 12 form body regions of the (n-channel) MOSFET $T_1$, which is composed of a plurality of transistor cells. The p-wells 12 and the n-doped semiconductor body form first pn-junctions J1, which can be regarded as reverse diode $D_R$ (see FIG. 1) of the MOSFET $T_1$. It should be noted, that FIG. 2 illustrates a cross section, wherein the p-wells 12 (body regions) appear separated in the depicted cross-sectional plane. However, the p-wells may be coherently linked together in another cross-sectional plane so that one coherent body-region is formed. Analogously, the drain regions of the individual transistor cells may be one coherent drain region formed by the substrate 10. However, vertical transistors composed of a plurality of (coherent or non-coherent) transistor cells, are as such known and thus not further discussed here.

At least one source region 13 is embedded in each p-well 12. The source regions 13 are doped with dopants of the first type. In the present example, the source regions 13 are n-doped to form an n-channel MOSFET. As mentioned above with regard to the p-wells 12, the source regions 13 appear separated in the depicted cross section, but may be coherently linked together in another cross-sectional plane, so as to effectively form one coherent source region. This is, however, not necessarily the case. A body contact region 14 may also be embedded in each p-well 12. The body contact regions 14 are doped with dopants of the same type as the p-well, but a higher concentration of dopants is applied to allow an ohmic contact of the p-well 12. The source regions 13 and the surrounding p-well 13 form second pn-junctions J2 which are, however, usually short-circuited by the source electrode 16 disposed on the top surface of the semiconductor body and directly connecting source regions 13 and body contact regions 14 with only negligible ohmic resistance. The epitaxial layer 11 forms the (n-doped) drift region of the MOSFET $T_1$ whereas the substrate 10 forms the drain region of the MOSFET $T_1$. Usually the dopant concentration in the drift region is much lower than in the drain region (substrate 10). The source regions of each transistor cells may be all connected to an external source terminal of the MOSFET $T_1$. In the present example the common source terminal is the ground terminal GND. The drain region, i.e. the substrate 10, is connected to the output terminal OUT (see also FIG. 1).

Gate electrodes 15 may be arranged on the top surface of the semiconductor body 1. The gate electrodes 15 are, however, isolated from the surrounding semiconductor material. Usually silicon oxide is used as isolating material. The gate electrodes 15 are disposed adjacent to that part of the body regions 12 which separate source regions 13 from the drift regions epitaxial layer 11). When the gate electrode 15 is charged a conductive channel is generated in the body region 12 alongside the gate electrode 15. In the present example, the gate electrodes 15 are formed on the top surface of the semiconductor body and the channel current flows substantially parallel to the top surface before being drained in a vertical direction to the drain electrode. Alternatively, the gate electrodes may also be arranged in trenches. However, trench transistors are known as such and therefore not further discussed herein. In the present example only one transistor cell is illustrated. However, a power MOSFET usually is composed of a plurality (up to several thousands) of transistor cells connected in parallel.

As mentioned above, a further p-well 22 is formed in the semiconductor body 1. Like the p-wells 12, which form the body regions of the transistor cells, the p-well 22 adjoins the top surface of the semiconductor body 1 and extends into the semiconductor body in a vertical direction. The p-well 22 encloses further circuitry, e.g. analog and digital circuits, which are isolated using the pn-junction isolation formed by the pn-junction J3 between the p-well 22 and the surrounding n-doped semiconductor body 1. As the body regions 12, the p-well 22 may be formed using diffusion of ion implantation of dopants. Amongst other circuit components, at least a heavily p-doped well contact region 24 and an n-doped supply contact region 23 are embedded in the p-well 22. To ensure that the pn-junction J3 is reverse biased during normal operation and thus operates as pn-junction isolation, the well contact region 24 is electrically connected to the further p-wells 12 (body regions) and thus to the source electrode of the MOSFET $T_1$, whereas the substrate 10 is connected with the drain electrode. As, during normal operation, the drain potential is higher than the source potential of the MOSFET $T_1$, the pn-junction J3 is normally reverse biased and isolates the circuitry embedded in the p-well 22 from the surrounding n-doped semiconductor body 1. The supply contact region 23 is connected to a supply node $SUP_{INT}$ providing a supply voltage, in the present example the internal supply voltage $V_{DDint}$. The well contact region 24 is electrically connected to the ground terminal GND and thus is supplied with ground potential $V_{GND}$.

The example of FIG. 2 also illustrates an ESD protection structure, which includes a resistor $R_{ESD}$ and a first ESD protection circuit 31 and a second ESD protection circuit 32. The resistor $RF_{ESD}$ is connected between the supply terminal SUP and the internal supply node $SUP_{INT}$; the first ESD circuit 31 is connected between the supply terminal SUP and ground, whereas the second ESD circuit 32 is connected between the internal supply node SUP' and ground. A gate driver 30 is also symbolized in FIG. 4. The gate driver generates a gate signal supplied to the gate electrodes 15 in accordance with an input signal $S_{IN}$. The gate driver 30 may be integrated in the p-well 22 and supplied with the internal supply voltage $V_{DD}$.

As can be seen from FIG. 2, the pn-junction J1 becomes forward biased when the output voltage $V_{OUT}$ is negative, which can be caused by various effects as discussed above. As a result the reverse diode $D_R$ of the MOSFET $T_1$ becomes forward biased and current flows from the body regions 12 into the surrounding epitaxial layer 11. Similarly, the pn-junction J3 becomes forward biased and current flows from the p-well 22 into the epitaxial layer 11. This can activate various undesirable parasitic devices. For example, the pn-junction J3 may act as the base-emitter diode of a parasitic bipolar junction transistor (BJT) $Q_1$, which is formed by the n-doped epitaxial layer 11 (emitter), the p-well 22 (base), and the n-doped supply contact region(s) 23 (collector) embedded in the p-well 22. Therefore, the current through the pn-junction J3 can be seen as base current activating the parasitic BJT $Q_1$. When active, the BJT $Q_1$ has a collector-emitter saturation voltage $V_{CEsat}$ of about 0.5 volts. So assuming the output voltage $V_{OUT}$ (drain voltage of the MOSFET $T_1$) is approximately −1.5 volts and the supply voltage $V_{DD}$ at the supply terminal SUP is 5.5 volts results in a voltage drop of 6.5 volts across the resistor $RF_{ESD}$ which limits the current through the chip to 32.5 milliamperes for $R_{ESD}$=200 Ohms. The internal supply voltage $V_{DDint}$ collapses to −1 volt. As a result, the gate driver may not be able to generate a gate signal to switch the power MOSFET $T_1$ on; furthermore all digital information stored in circuits residing in the p-well 22 (e.g., latches, etc.) may be lost. As such, the device including the chip may be inoperative during reverse current and negative output voltage. Even a temporary forward biasing of the pn-junctions J1 and J3 may lead to a reset of the circuitry embedded in the p-well 22.

For instance, in some circumstances the pn-junction forming the mentioned pn-junction isolation may become forward biased, which makes the pn-isolation ineffective. As a result, current can pass through the pn-junction between n-substrate and p-well, which may negatively affect the operation of the circuitry implemented in the affected p-well. The forward biasing of the pn-junction isolation may occur in various situations. For example, the potential of the drain electrode may become negative with respect to the potential of the source electrode when switching inductive loads with low-side n-channel MOSFETs. The negative drain potential entails a negative substrate potential thus forward-biasing the pn-junction isolation between the n-substrate and the p-wells formed therein. A similar problem may occur due to a shift of the ground potential as a result of a voltage drop in the ground line. Moreover, disturbances in the supply lines (e.g., due to electrostatic discharges, ESD) may also lead to a forward biasing of the mentioned pn-junction isolations.

Figure 3:
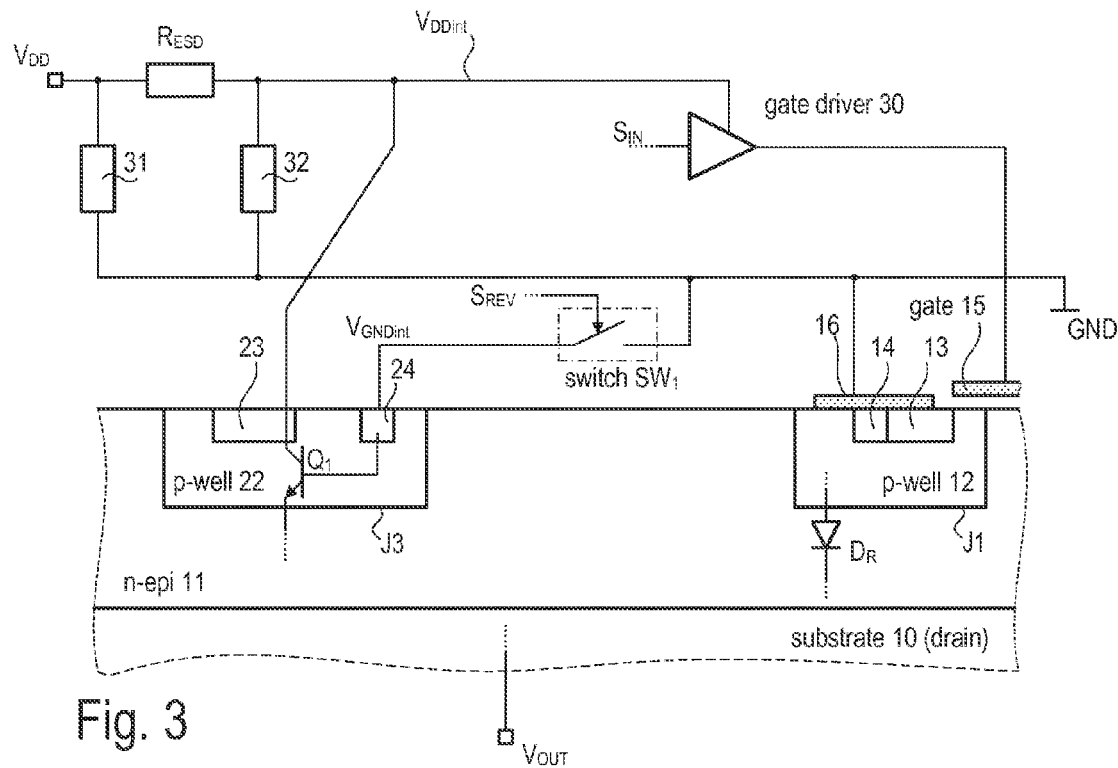
FIG. 3 illustrates a semiconductor device including a vertical power MOS transistor and additional low power circuitry separated from the substrate by a pn-junction isolation.

To avoid the problems discussed above, the connection between the p-wells 12 (body regions) and the p-well 22 can be interrupted using a switch $SW_1$. This situation is illustrated in FIG. 3 which is essentially the same as FIG. 2 except that the switch $SW_1$ is connected between the p-wells 12 (body-regions) and the p-well 22, which is electrically contacted via the well contact regions 24. The switch $SW_1$ is controlled by a drive signal $S_{REV}$ which is indicative of whether, or not, the pn-junction J1 (i.e. the reverse diode $D_R$) is forward biased and thus conductive. The drive signal $S_{REV}$ is generated by a detection circuit which is configured to detect a forward biasing of the pn-junction $J_1$. Examples of the detection circuit will be discussed later.

Figure 4:
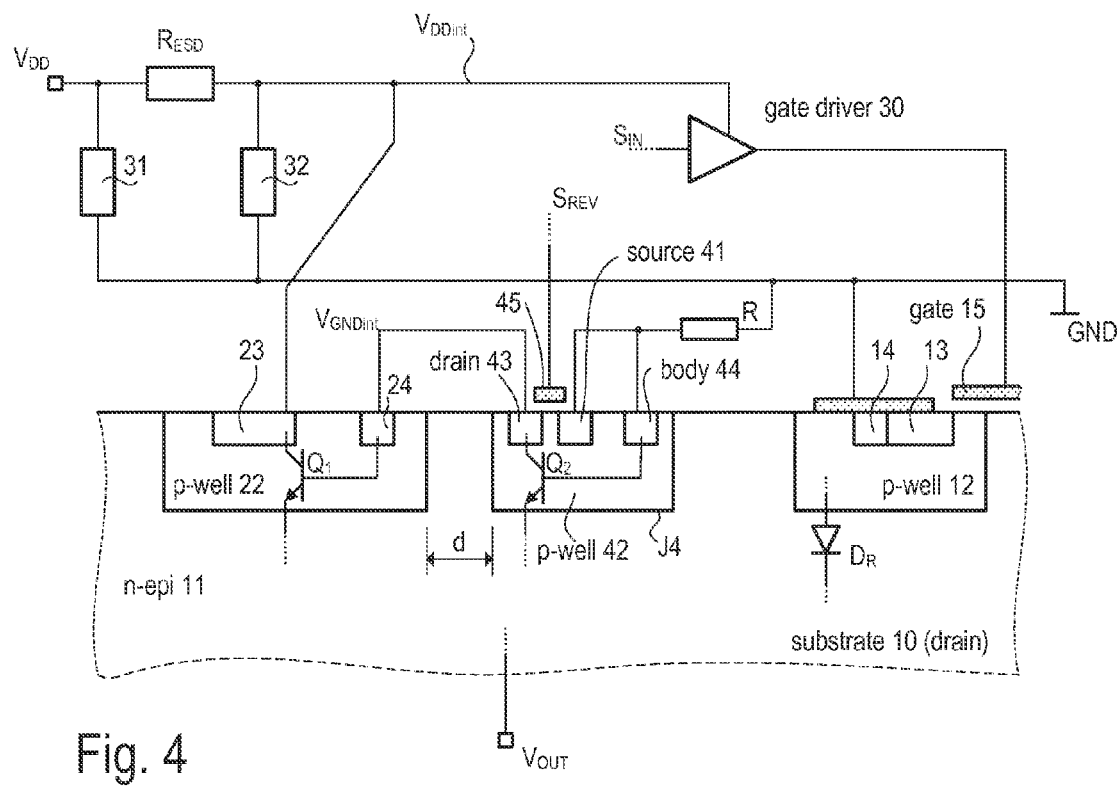
FIG. 4 illustrates the example of FIG. 3 in more detail.

FIG. 4 illustrates one implementation of the switch $SW_1$ which is configured to electrically isolate p-well 22 from p-well 12 (and thus from the source electrode of the MOSFET $T_1$). Apart from the implementation of the switch $SW_1$, which is not shown in detail in FIG. 3, the example of FIG. 4 is essentially the same as the previous example of FIG. 3. In the present example, the switch $SW_1$ is implemented as a further lateral MOS transistor which is embedded in a separate well region 42, which is also doped with dopants of a second type and thus referred to as p-well 42. Similar to the p-well 22, the p-well 42 forms a pn-junction J4 with the surrounding n-doped epitaxial layer 11. In a horizontal direction, the p-well 42 is arranged between the p-well 22 and the array of p-wells 12 (i.e. the transistor cell array). The p-well 42 includes a drain region 43 and a source region 41 as well as a body contact region 44. The drain region 43 and the source region 41 are n-doped to form a lateral n-channel MOS transistor. In a horizontal direction, drain region 43 and source region 41 are separated by a portion of the p-well 42 which forms the body region of the MOS transistor. Isolated from the body region (e.g. by an oxide layer) a gate electrode 45 extends of the top surface of the semiconductor body 1 between the source region 41 and the drain region 43. The source region 41 and the body contact region 44 may be short circuited and connected to the source electrode of the power MOSFET $T_1$ via a resistor R. The drain region 43 is connected to the well contact region 24 of the p-well 22. When the gate signal $S_{REF}$ drives the gate potential to a sufficient high level (with respect to potential of the p-well 42) then the MOS channel becomes conductive (i.e. switch $SW_1$ is closed, see FIG. 3) and provides a low resistive connection between the well contact region 24 (of p-well 22) and the resistor R. Thus the potential of the p-well 22 is tied to the potential of the p-wells 12 (body regions of power MOSFET $T_1$) via resistor R as long as the MOS transistor in p-well 42 (i.e. switch $SW_1$) is conductive. However, as no substantial current flows through the resistor R during normal operation (i.e. pn-junction isolation is active and switch $SW_1$ is closed) the resistor causes no or only a negligibly low voltage drop. However, when the pn-junctions J1, J3, and J4 are reverse biased, the resistor R limits the current through the pn-junction J4.

A second parasitic BJT $Q_2$ is formed in p-well 42 analogously to the parasitic BJT $Q_1$ in p-well 22. The pn-junction J4 formed by the p-well 42 and the n-doped epitaxial layer 11 is the base-emitter diode of BJT $Q_2$; the n-doped source and drain regions 41 and 43 can be regarded as the collectors of the BJT $Q_2$. When the pn-junctions J1, J3, and J4 are forward biased, then the parasitic BJT $Q_2$ becomes active and, as a result, the collector potential of BJT $Q_2$ (and thus the drain potential of the MOS transistor in p-well 42 as well as the potential of p-well 22, which may contain numerous logic devices and is connected to p-well 42 via the contact region 24) is pulled down to a value of $V_{OUT}+V_{CEsat}$. Assuming (as in the example above) an output voltage of 1.5 volts and a collector-emitter saturation voltage $V_{CEsat}$ of 0.5 volts, the drain region 43 is pulled to a potential of −1 volt with respect to ground potential. In such a situation, the MOS transistor in the p-well 42 as well as any logic circuitry in p-well 22 are inactive and the current flowing through the PN-junction J4 is limited by resistor R to an acceptable value. Most of the substrate current (flowing from p-wells into the epitaxial layer 11) is directed through the p-wells 12 of the power MOSFET $T_1$. As a result, the active BJT $Q_2$ in p-well 42 sets the effective base-emitter-voltage of the BJT $Q_1$ in p-well 22 to the value $V_{CEsat}$, which is lower than the threshold voltage of the base-emitter-diode of the BJT $Q_1$; thus an activation of BJT $Q_1$ is prevented. In this situation the lateral MOS transistor in p-well 42 is driven into an inactive state.

Figure 5:
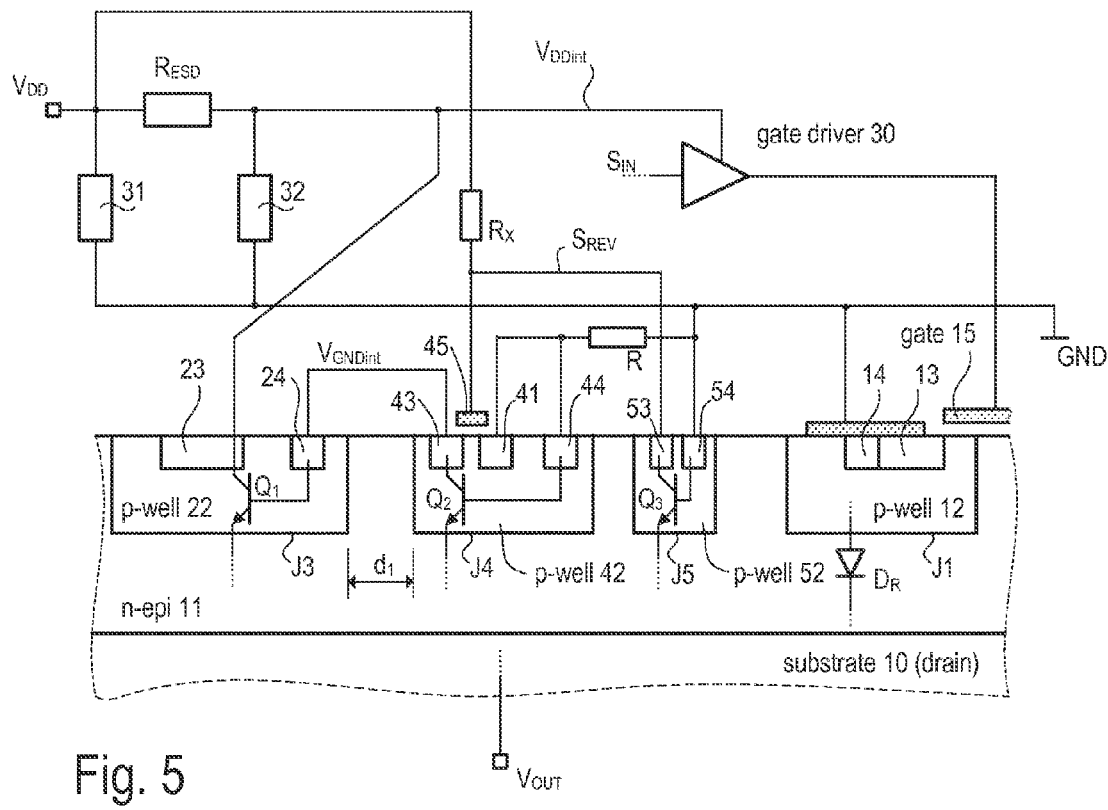
FIG. 5 illustrates the example of FIG. 4 in more detail.

The gate signal $S_{REV}$ for driving the MOS transistor in p-well 42 on and off is provided by a detection circuit as mentioned above, which is configured to detect a forward biasing of the pn-junctions J1, J3, and J4. One example implementation of the detection circuit is illustrated in FIG. 5. Apart from the implementation of the detection circuit, which is not shown in FIG. 4, the example of FIG. 5 is essentially the same as the previous example of FIG. 4. To avoid repetitions the further discussion focuses on the detection circuit and its interaction with the switch $SW_1$.

The detection circuit is formed by providing a further p-well 52 (horizontally) between the p-well 42 and the p-wells 12, which form the body regions of the power MOSFET $T_1$. The further p-well 52 includes an n-doped collector region 53 and a p-doped well contact region 54, such that another vertical BJT $Q_3$ is formed, wherein the n-doped epitaxial layer 11 forms the emitter, the p-well 52 forms the base, and the collector region 53 the collector of the BJT $Q_3$. The pn-junction J5 between the p-well 52 and the epitaxial layer 11 is the base-emitter diode of the BJT $Q_3$. The well contact region 54 (i.e. the base of BJT $Q_3$) is electrically connected to the p-wells 12 (body regions) of the power MOSFET $T_1$ and thus to the source potential of the power MOSFET $T_1$ (ground potential $V_{GND}$ in the present example). The collector region 53 is connected (e.g. via a low ohmic current path) to the gate electrode 45 of the MOS transistor in p-well 42. Collector region 53 and gate electrode 45 are further connected to the supply terminal SUP via a high ohmic resistor $R_X$.

The voltage signal $S_{REV}$ present at the collector region 53 can be regarded as output signal of the detection circuit. During normal operation, i.e. when the output voltage $V_{OUT}$ is equal to or greater than the ground potential, the pn-junctions J1, J3, J4, and J5 are reverse biased and operate as pn-junction isolation. The parasitic BJTs $Q_1$, $Q_2$, and $Q_3$ are inactive and, as a result, the collector potential of the collector region 53 of the BJT $Q_3$ is pulled to a high level ($S_{REV}=V_{DD}$) by the pull-up resistor $R_X$. Therefore, the gate potential of the gate electrode 45 is also at a high level (i.e. at $V_{DD}$) and the MOS transistor in p-well 42 (i.e. the switch $SW_1$, see FIG. 3) is closed; the potential of the p-well 22 is tied to the potential of the p-wells 12, which form the body regions of the power-MOSFET $T_1$.

When the output voltage $V_{OUT}$ is forced to negative values (e.g. due to an inductive load), then the pn-junctions J1 as well as the pn-junction J5 of the detector circuit is forward biased. As a result, a base-emitter current flows through the base-emitter diode of BJT $Q_3$ into the epitaxial layer 11 thereby activating the BJT $Q_3$ and pulling down the collector potential of the collector region 53 to a value $S_{REV}=V_{OUT}+VCE_{sat}$ (which may be also negative if, e.g., $V_{OUT}=-1.5$ V and $V_{CEsat}=0.5$ V). Due to the low level of the gate signal $S_{REV}$ the MOS transistor in p-well 42 is deactivated (i.e. switch $SW_1$ is switched off), thus decoupling the p-well 22 from the p-wells 12 and ground potential. As a result an activation of the BJT $Q_1$ in p-well 22 is prevented and excessive input current through the ESD protection circuit (which would lead to a collapse of the internal supply voltage $V_{DDint}$) is avoided.

Figure 6:
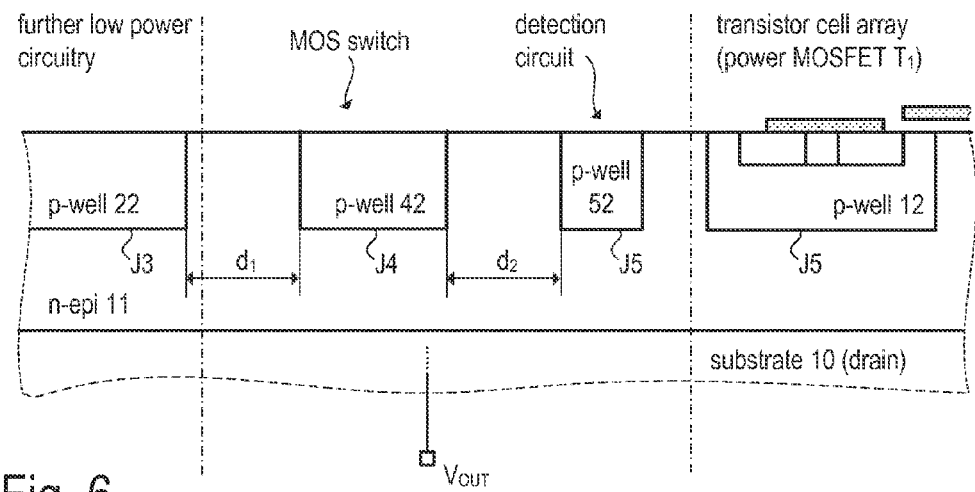
FIG. 6 illustrates the spacing between the individual components integrated in the semiconductor body in accordance with the example of FIG. 5.

FIG. 6 illustrates a cross section of the same semiconductor chip wherein some details have been omitted in order to keep the drawing simple. FIG. 6 illustrates the spacing between p-wells 22 and 42 and between p-wells 42 and 52. In a horizontal (lateral) direction the p-well 22 and the p-well 42 (in which the lateral MOS switch is implemented) are spaced apart from each other by a distance $d_1$. Similarly, the p-well 42 and the p-well 52 (which includes part of the detection circuit for detecting a forward biasing of the substrate diode $D_R$), are spaced apart from each other by a distance $d_2$. The spacing between p-wells 22 and 42 and between p-wells 42 and 52 is provided to increase the base lengths of the parasitic lateral pnp-type bipolar junction transistors $Q_4$ and $Q_5$ formed the respective p-wells. Increasing the distances $d_1$ and $d_2$ significantly reduces the current gain of the BJTs $Q_4$ and $Q_5$ thus making the parasitic BJTs practically ineffective. As such, the parasitic pnp BJTs are effectively suppressed.

As an alternative to increasing the spacing between the p-wells, other techniques for suppressing the parasitic pnp-type BJTs $Q_4$ and $Q_5$ may be used. For example, a deep trench isolation (DTI) may be formed between the p-wells 22 and 42 and/or between the p-wells 42 and 52. However, other types of parasitic BJT suppression may be applicable.

Although the techniques have been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated example implementations of the techniques. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A semiconductor device comprising:
  a semiconductor substrate doped with dopants of a first type;
  a vertical transistor composed of one or more transistor cells, each transistor cell having a first region formed in the substrate and doped with dopants of a second type; the first regions forming first pn-junctions with the surrounding substrate;
  at least a first well region formed in the substrate and doped with dopants of a second type to form a second pn-junction with the substrate, the first well region being electrically connected to the first regions of the vertical transistor via a semiconductor switch;
  and a detection circuit integrated in the substrate, wherein the detection circuit detects whether the first pn-junctions are reverse biased, wherein the switch is closed when the first pn-junctions are reverse biased and the switch is opened when the first pn-junctions are not reverse biased.

2. The semiconductor device of claim 1,
  wherein the semiconductor switch includes a further transistor, which is a lateral transistor that is integrated in a second well region;
  wherein the second well region is doped with dopants of a second type to form a third pn-junction with the substrate; and
  wherein the second well region is electrically coupled to the first regions of the vertical transistor.

3. The semiconductor device of claim 2,
  wherein the second well region is electrically connected to the first regions of the vertical transistor via a resistor.

4. The semiconductor device of claim 2, wherein the further transistor is a lateral MOS transistor.

5. The semiconductor device of claim 4,
  wherein the second well region is a body region of the further transistor.

6. The semiconductor device of claim 4,
  wherein the detection circuit generates a gate signal to activate or deactivate the further transistor dependent on whether or not the first pn-junctions are not reverse biased.

7. The semiconductor device of claim 2,
wherein the detection circuit is integrated in a third well region which is doped with dopants of the second type to form a fourth pn-junction with the substrate.

8. The semiconductor device of claim 7,
wherein the third well region includes a collector region which is doped with dopants of the first type to form a fifth pn-junction with the third well region, the fourth and the fifth pn-junctions forming a bipolar junction transistor.

9. The semiconductor device of claim 7,
wherein the third well region includes a collector region which is doped with dopants of the first type to form a fifth pn-junction with the third well region, the fourth and the fifth pn-junctions forming a bipolar junction transistor; and
wherein the collector region is coupled to a gate electrode of the a further MOS transistor.

10. The semiconductor device of claim 9,
wherein the collector region is further connected to a supply potential via a resistor.

11. The semiconductor device of claim 1,
wherein the first well region includes at least one of: analog circuitry, digital logic circuitry, a gate driver circuit, communication circuitry, which are isolated from the substrate by a pn-junction isolation provided by the second pn-junction.

12. The semiconductor device of claim 1, wherein the vertical transistor is a MOS transistor and the first regions are the body regions of the vertical transistor.

13. The semiconductor device of claim 1, wherein the vertical transistor is composed a plurality of transistor cells having second regions; the second regions of the transistor cells being electrically connected to each other.

14. The semiconductor device of claim 13, wherein the second regions of the transistor cells are coherently linked together.

* * * * *